United States Patent
Chuang et al.

(10) Patent No.: US 7,129,151 B2
(45) Date of Patent: Oct. 31, 2006

(54) PLANARIZING METHOD EMPLOYING HYDROGENATED SILICON NITRIDE PLANARIZING STOP LAYER

(75) Inventors: Ping Chuang, Taichung (TW); Henry Lo, Hsinchu (TW); Mei Shang Zhou, Singapore (SG)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 173 days.

(21) Appl. No.: 10/701,802

(22) Filed: Nov. 4, 2003

(65) Prior Publication Data

US 2005/0095864 A1    May 5, 2005

(51) Int. Cl.
*H01L 21/20* (2006.01)

(52) U.S. Cl. ..................................... 438/478

(58) Field of Classification Search ............... 438/790, 438/789, 780, 761, 693, 692, 689, 633, 623, 438/622, 5, 691, 481, 478; 257/642
See application file for complete search history.

(56) References Cited

U.S. PATENT DOCUMENTS

| | | | |
|---|---|---|---|
| 4,751,191 A | 6/1988 | Gonsiorawski et al. | |
| 5,272,360 A | 12/1993 | Todoroki et al. | |
| 5,952,243 A * | 9/1999 | Forester et al. | 438/693 |
| 6,004,875 A * | 12/1999 | Cathey et al. | 438/634 |
| 6,042,741 A | 3/2000 | Hosali et al. | |
| 6,043,155 A * | 3/2000 | Homma et al. | 438/691 |
| 6,232,218 B1 | 5/2001 | Cathey et al. | |
| 6,287,990 B1 * | 9/2001 | Cheung et al. | 438/780 |
| 6,943,096 B1 * | 9/2005 | Wang et al. | 438/484 |

FOREIGN PATENT DOCUMENTS

TW    457262    1/2001

* cited by examiner

*Primary Examiner*—Carl Whitehead, Jr.
*Assistant Examiner*—Monica D. Harrison
(74) *Attorney, Agent, or Firm*—Tung & Associates

(57) ABSTRACT

A planarizing method for forming a patterned planarized aperture fill layer within an aperture employs a planarizing stop layer formed of a reductant based material, such as but not limited to a hydrogenated silicon nitride material. The reductant based material provides the planarizing stop layer with enhanced planarizing stop properties. The method is particularly useful within the context of CMP planarizing methods.

20 Claims, 2 Drawing Sheets

PLANARIZING METHOD EMPLOYING HYDROGENATED SILICON NITRIDE PLANARIZING STOP LAYER

BACKGROUND OF THE INVENTION

1. Field of the Invention

The present invention relates generally to methods for fabricating microelectronic products. More particularly, the present invention relates to planarizing methods for fabricating microelectronic products.

2. Description of the Related Art

Common in the art of microelectronic product fabrication is the use of planarizing methods such as chemical mechanical polish (CMP) planarizing methods. Planarizing methods provide advantages when fabricating microelectronic products insofar as planarizing methods often allow for fabrication of devices and structures which are not otherwise readily fabricated.

While planarizing methods are thus desirable and often essential when fabricating microelectronic products, planarizing methods are nonetheless not entirely without problems. In that regard, it is often difficult to provide planarizing methods with enhanced planarizing stop properties.

It is thus towards the goal of providing planarizing methods with enhanced planarizing stop properties that the present invention is directed.

Various methods have been disclosed for fabricating microelectronic products with desirable properties.

Included but not limiting among the methods are methods disclosed within: (1) Gonsiorawski et al., in U.S. Pat. No. 4,751,191 (a method for fabricating a solar cell product by providing a patterned hydrogenated silicon nitride layer as a mask layer when forming a grid electrode therein); and (2) Cathey et al., in U.S. Pat. No. 6,232,218 (a plasma etch method for fabricating a microelectronic product by employing a hydrogenated silicon nitride plasma etch stop layer when plasma etching a silicon oxide layer).

Desirable in the microelectronic fabrication arts are planarizing methods with enhanced planarizing stop properties for fabricating microelectronic products.

It is towards the foregoing object that the present invention is directed.

SUMMARY OF THE INVENTION

A first object of the present invention is to provide a planarizing method for fabricating a microelectronic product.

A second object of the invention is to provide a planarizing method in accord with the first object of the invention, wherein the planarizing method has enhanced planarizing stop properties.

In accord with the objects of the present invention, the present invention provides a method for fabricating a microelectronic product.

To practice the method of the invention, there is first provided a substrate having formed thereupon a patterned planarizing stop layer which defines the location of an aperture formed within the substrate. Within the invention, the patterned planarizing stop layer is formed of a reductant based material, such as but not limited to a hydrogenated silicon nitride material. There is then formed upon the patterned planarizing stop layer and within the aperture a blanket planarizable layer. Finally, there is then planarized the blanket planarizable layer while employing the patterned planarizing stop layer to form a patterned planarized layer within the aperture.

The present invention provides a planarizing method for fabricating a microelectronic product, wherein the planarizing method has enhanced planarizing stop properties.

The invention realizes the foregoing object by employing within the planarizing method a planarizing stop layer formed of a reductant based material, such as a hydrogenated silicon nitride material.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a planarizing method for fabricating a microelectronic product, wherein the planarizing method has enhanced planarizing stop properties.

The invention realizes the foregoing object by employing within the planarizing method a planarizing stop layer formed of a reductant based material, such as but not limited to a hydrogenated silicon nitride material.

While the present invention provides particular value within the context of forming, with enhanced planarizing stop properties, an isolation region within a semiconductor substrate while employing a CMP planarizing method, the invention is not intended to be so limited. Rather, the invention may be employed for forming within apertures within substrates formed of materials including but not limited to conductor materials, semiconductor materials and dielectric materials patterned planarized aperture fill layer formed of materials including but not limited to conductor materials, semiconductor materials and dielectric materials. The present invention may also be employed within the context of dual damascene apertures as well as single damascene apertures. Applicability of the invention may be determined absent undue experimentation by ascertaining a planarizing rate of a reductant based material planarizing stop layer within a planarizing method of interest. The present invention is applicable within both reactive ion etch (RIE) etchback planarizing methods and CMP planarizing methods.

FIG. 1 to FIG. 4 show a series of schematic cross-sectional diagrams illustrating the results of progressive stages of fabricating a microelectronic product in accord with the present invention.

Figure 1:
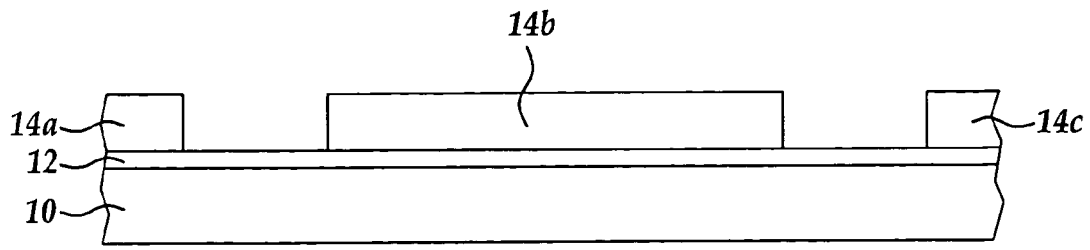
FIG. 1, FIG. 2, FIG. 3 and FIG. 4 show a series of schematic cross-sectional diagrams illustrating the results of progressive stages of fabricating a microelectronic product in accord with the present invention.

FIG. 1 shows a substrate 10 having formed thereupon a blanket planarizing stop layer 12, in turn having formed thereupon a series of patterned photoresist layers 14a, 14b and 14c.

Within the invention, the substrate 10 may be employed within a microelectronic product selected from the group including but not limited to semiconductor products, ceramic substrate products and optoelectrtonic products. The substrate 10 may be formed of materials as are conventional in the art of microelectronic fabrication. Such materials may include, but are not limited to, conductor materials, semiconductor materials, dielectric materials and laminates thereof. Preferably, the substrate 10 consists of or comprises a semiconductor substrate employed for fabricating a semiconductor product. The substrate 10 may also have formed therein microelectronic devices as are conventional within the microelectronic product fabricated employing the substrate 10.

Within the invention, the blanket planarizing stop layer 12 is formed of a reductant based material, such as a hydrogenated silicon nitride material. Other reductant based materials, such as other hydrogenated materials (i.e., hydrogenated silicon carbide materials and hydrogenated silicon oxide materials), may also be employed. Although the hydrogenated silicon nitride material may be formed employing any of several methods, including intrinsic hydrogenation deposition methods and extrinsic post treatment hydrogenation methods, the hydrogenated silicon nitride material is preferably formed employing a plasma enhanced chemical vapor deposition (PECVD) method employing silane and ammonia source materials. The PECVD method also employs (for processing at least eight inch diameter and twelve inch diameter substrates): (1) a reactor chamber pressure of about 1 to about 20 torr; (2) a radio frequency source power of from about 200 to about 500 watts; (3) a substrate 10 temperature of from about 300 to about 600 degrees centigrade; (4) a silane flow rate of from about 500 to about 2000 standard cubic centimeters per minute (sccm); (5) an ammonia flow rate of from about 4000 to about 9000 sccm; and (6) a helium flow rate of from about 2000 to about 8000 sccm. Within the context of the foregoing deposition parameters, the blanket planarizing stop layer 12 is formed with a hydrogen atomic composition of from about 0.01 to about 0.3 (i.e., $Si_xN_yH_z$ where $z/(x+y+z)=0.05$ to about 0.30. Typically, the blanket planarizing stop layer 12 is formed to a thickness of from about 500 to about 2000 angstroms.

Within the invention, the series of patterned photoresist layers 14a, 14b and 14c may be formed of photoresist materials as are conventional in the art of microelectronic fabrication, including but not limited to positive photoresist materials and negative photoresist materials. Typically, each of the series of patterned photoresist layers 14a, 14b and 14c is formed to a thickness of from about 2500 to about 20000 angstroms.

Figure 2:
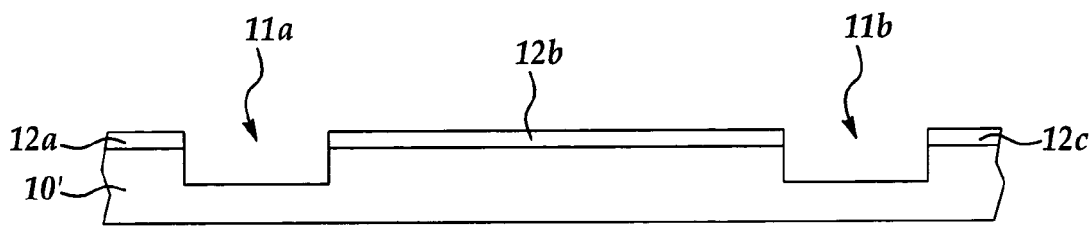

FIG. 2 shows the results of further processing of the microelectronic product of FIG. 1.

FIG. 2 shows the results of sequentially etching the blanket planarizing stop layer 12 and the substrate 10 while employing the series of patterned photoresist layers 14a, 14b and 14c as an etch mask, to form a series of patterned planarizing stop layers 12a, 12b and 12c and an etched substrate 10' having formed therein a pair of apertures 11a and 11b defined by the series of patterned planarizing stop layers 12a, 12b and 12c. FIG. 2 also illustrates the results of subsequently stripping the series of patterned photoresist layers 14a, 14b and 14c from the series of patterned planarizing stop layers 12a, 12b and 12c.

Within the invention when the substrate 10 consists of a semiconductor substrate, the pair of apertures 11a and 11b is formed within the etched substrate 10' while employing an anisotropic plasma etch method which typically employs a fluorine containing etchant gas composition (for etching the blanket planarizing stop layer 12) followed by a chlorine containing etchant gas composition (for etching the substrate 10). Under such circumstances, the pair of apertures 11a and 11b is intended as a pair of isolation trenches into which is formed a pair of isolation regions. Typically, the pair of apertures 11a and 11b when formed as the pair of isolation trenches is formed of a linewidth from about 0.065 to about 0.5 microns.

The series of patterned photoresist layers 14a, 14b and 14c may be stripped employing methods and materials as are conventional in the art of microelectronic fabrication.

Figure 3:
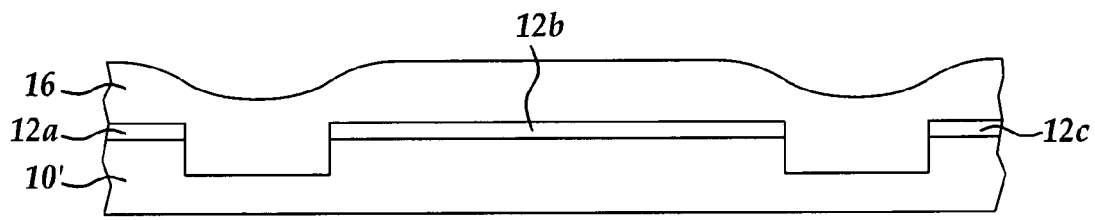

FIG. 3 shows the results of further processing of the microelectronic fabrication of FIG. 2.

FIG. 3 shows the results of forming a blanket planarizable aperture fill layer 16 upon the series of patterned planarizing stop layers 12a, 12b and 12c, and filling the pair of apertures 11a and 11b.

Within the invention, the blanket planarizable aperture fill layer 16 may in general be formed of materials including but not limited to conductor materials, semiconductor materials and dielectric materials. However, within the preferred embodiment when the substrate 10 consists of a semiconductor substrate, the blanket planarizable aperture fill layer 16 is typically formed at least in part of a silicon oxide aperture fill material. Typically, the blanket planarizable aperture fill layer 16 is formed to a thickness of from about 2500 to about 7000 angstroms.

Figure 4:
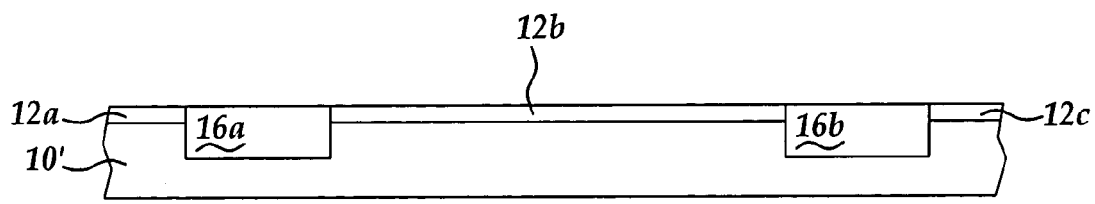

FIG. 4 shows the results of further processing of the microelectronic product of FIG. 3.

FIG. 4 shows the results of planarizing the blanket planarizable aperture fill layer 16 to form a pair of patterned planarized aperture fill layers 16a and 16b while employing the series of patterned planarizing stop layers 12a, 12b and 12c as planarizing stop layers.

Within the invention, the pair of patterned planarized aperture fill layers 16a and 16b may be formed from the blanket aperture fill layer 16 while employing planarizing methods including but not limited to RIE etchback planarizing methods and CMP planarizing methods. CMP planarizing methods are in particular preferred within the invention. When the substrate 10 is a semiconductor substrate and the blanket planarizable aperture fill layer 16 is formed at least in part of a silicon oxide material, the blanket planarizable aperture fill layer 16 may be CMP planarized employing a cerium oxide slurry composition absent additives, such as surfactant additives. Within the invention, since the series of patterned planarizing stop layers 12a, 12b and 12c is formed of the hydrogenated silicon nitride material rather than a non-hydrogenated silicon nitride material, the series of patterned planarizing stop layers is less susceptible to erosion when forming the pair of patterned planarized aperture fill layers 16a and 16b from the blanket planarizable aperture fill layer 16. Thus, the invention provides a planarizing method with enhanced planarizing stop properties.

EXAMPLES

Two semiconductor substrates were fabricated generally in accord with the schematic cross-sectional diagrams of FIG. 1 and FIG. 2.

Formed over a first of the two semiconductor substrates was a blanket planarizing stop layer formed of a non-hydrogenated silicon nitride material formed to a thickness of about 1100 angstroms. The non-hydrogenated silicon nitride material was formed employing a low pressure chemical vapor deposition (LPCVD) method employing dichlorosilane and ammonia source materials. The LPCVD method also employed: (1) a reactor chamber pressure of about 50 torr; (2) no radio frequency source power or bias power; (3) a semiconductor substrate temperature of about 750 degrees centigrade; (4) a dichlorosilane flow rate of about 1500 sccm; and (5) an ammonia flow rate of about 7000 sccm.

Formed over the second of the two semiconductor substrates was a blanket planarizing stop layer formed of a hydrogenated silicon nitride material formed to a thickness of about 7100 angstroms. The hydrogenated silicon nitride material was formed employing a PECVD method employing silane and ammonia source materials. The PECVD method also employed: (1) a reactor chamber pressure of about 5 torr; (2) a source radio frequency power of about 400 watts; (3) a substrate temperature of about 400 degrees centigrade; (4) a silane flow rate of about 1500 sccm; (5) an ammonia flow rate of about 7500 sccm; and (6) a helium flow rate of about 7000 sccm.

Figure 5:
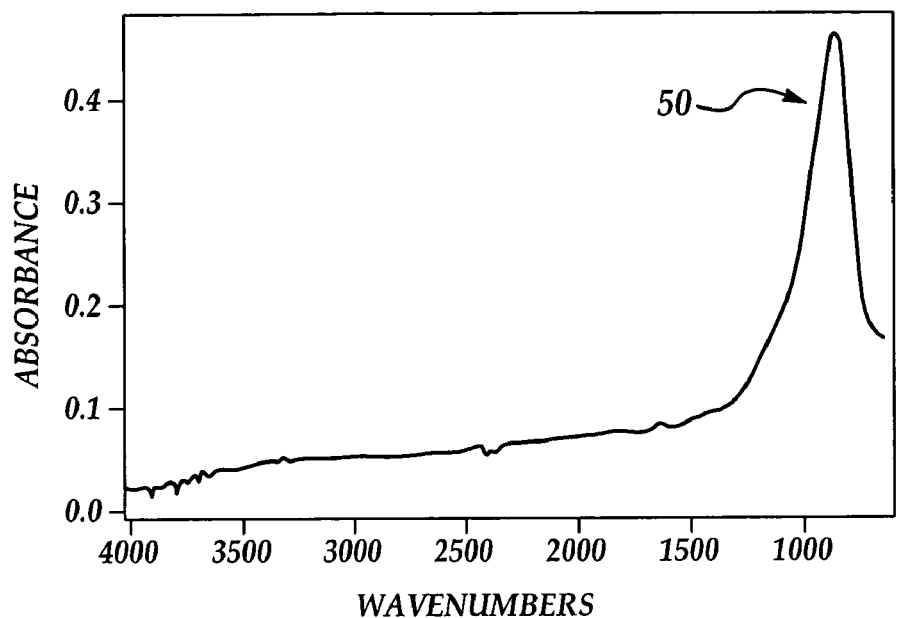
FIG. 5 and FIG. 6 show a pair of infrared spectra which characterize a hydrogenated silicon nitride layer in accord with the present invention.
Figure 6:
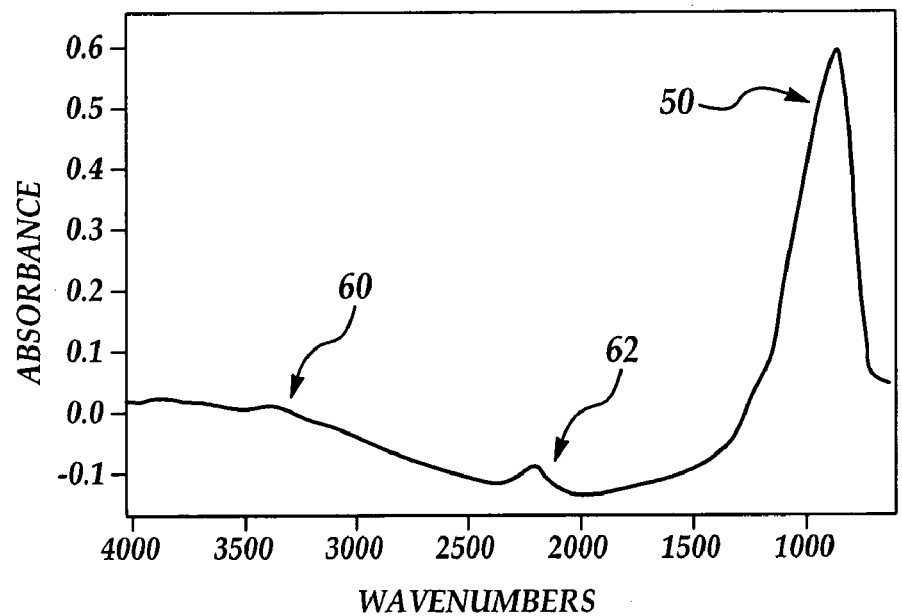

Infrared spectra were obtained for each of the two blanket planarizing stop layers. The infrared spectra are illustrated in FIG. 5 (non-hydrogenated silicon nitride blanket planarizing stop layer) and FIG. 6 (hydrogenated silicon nitride blanket planarizing stop layer). The presence of hydrogen within the hydrogenated silicon nitride material is confirmed within FIG. 6 by the presence of a nitrogen-hydrogen peak 60 at 3260 wavenumbers and a silicon-hydrogen peak 62 at 2180 wavenumbers. Both of those peaks are absent within FIG. 5. A silicon-nitrogen peak 50 is present within both spectra at 840 wavenumbers.

The pair of semiconductor substrates having formed thereupon the pair of blanket planarizing stop layers was etched to form two series of patterned planarizing stop layers defining two series of apertures within two etched semiconductor substrates. A pair of silicon oxide blanket aperture fill layers was formed upon the two series of patterned planarizing stop layers and filling the two series of apertures. The pair of silicon oxide aperture fill layers was planarized, while employing a CMP planarizing method. The CMP planarizing method also employed: (1) a 1~5 weight percent aqueous cerium oxide 1~5% slurry composition at a flow rate of about 100~300 cubic centimeters per minute (ccm); (2) a semiconductor substrate temperature of about 25 degrees centigrade; (3) a platen pressure of about 45 pounds per square inch (psi); and (4) a rotational speed of about 70 revolutions per minute (rpm). The aqueous cerium oxide 1~5% slurry composition contained no additional additives, such as surfactants.

Upon completion of the planarization of the pair of blanket planarizable aperture fill layers to form two series of patterned planarized aperture fill layers within the two series of apertures, thickness of the series of patterned planarizing stop layers were again measured. Results of the measurements are reported in Table I.

TABLE I

| Stop Layer Comp. | Thickness Removed |
|---|---|
| Non-Hydrogenated SiN | 1060 A |
| Hydrogenated SiN | 150 A |

As is seen from review of the data in Table I, a hydrogenated silicon nitride planarizing stop material provides a superior planarizing stop layer in comparison with a planarizing stop layer formed of a non-hydrogenated silicon nitride material. Thus, the present invention provides a planarizing method with enhanced planarizing stop properties.

The preferred embodiment and example of the invention are illustrative of the invention rather than limiting of the invention. Revisions and modifications may be made to materials, structures and dimensions in accord with the preferred embodiment and example of the invention while still providing a method in accord with the present invention, further in accord with the appended claims.

What is claimed is:

1. A method for fabricating a microelectronic product with reduced planarization layer loss comprising:
    providing a substrate having formed thereupon a patterned planarizing stop layer, said patterned planarizing stop layer defining an aperture formed within the substrate, the patterned planarizing stop layer comprising a reductant based material selected from the group consisting of hydrogenated silicon nitride and hydrogenated silicon carbide;
    forming upon the patterned planarizing stop layer and within the aperture a blanket planarizable layer; and
    planarizing the blanket planarizable layer while employing the patterned planarizing stop layer to form a patterned planarized layer within the aperture.

2. The method of claim 1 wherein the substrate is employed within a microelectronic product selected from the group consisting of semiconductor products, ceramic substrate products and optoelectronic products.

3. The method of claim 1 wherein the substrate comprises a material selected from the group consisting of conductor materials, semiconductor materials, dielectric materials and laminates thereof.

4. The method of claim 1 wherein the blanket planarizable layer comprises a material selected from the group consisting of conductor materials, semiconductor materials and dielectric materials.

5. The method of claim 1 wherein the patterned planarizing stop layer is formed to a thickness of from about 400 to about 1600 angstroms.

6. The method of claim 1 wherein the reductant based material consists essentially of hydrogenated silicon nitride material.

7. The method of claim 6 wherein the hydrogenated silicon nitride material is formed employing a plasma enhanced chemical vapor deposition method.

8. The method of claim 1 wherein the blanket planarizable layer is planarized employing a method selected from the group consisting of chemical mechanical polish planarizing methods and reactive ion etch etchback planarizing methods.

9. A method for fabricating a semiconductor product with reduced planarization layer loss comprising;
    providing a semiconductor substrate having formed thereover a patterned planarizing stop layer, said patterned planarizing stop layer defining an aperture formed within the semiconductor substrate, the patterned planarizing stop layer being formed of a reductant based material selected from the group consisting of hydrogenated silicon nitride and hydrogenated silicon carbide;
    forming upon the patterned planarizing stop layer and within the aperture a blanket planarizable layer; and
    planarizing the blanket planarizable layer while employing the patterned planarizing stop layer to form a patterned planarized layer within the aperture.

10. The method of claim 9 wherein the blanket planarizable layer comprises a dielectric material.

11. The method of claim 9 wherein the patterned planarizing stop layer is formed to a thickness of from about 400 to about 1600 angstroms.

12. The method of claim 9 wherein the reductant based material consists essentially of hydrogenated silicon nitride material.

13. The method of claim 12 wherein the hydrogenated silicon nitride material is formed employing a plasma enhanced chemical vapor deposition method.

14. The method of claim 9 wherein the blanket planarizable layer is planarized employing a method selected from the group consisting of chemical mechanical polish planarizing methods and reactive ion etch etchback planarizing methods.

15. A method for fabricating a microelectronic product with reduced planarization layer loss comprising:

provi台ng a substrate having formed thereupon a patterned planarizing stop layer, said patterned planarizing stop layer defining an aperture formed within the substrate, the patterned planarizing stop layer comprising hydrogenated silicon nitride ($Si_xN_yH_z$);

forming upon the patterned planarizing stop layer and within the aperture a blanket planarizable layer comprising silicon oxide material; and planarizing the blanket planarizable layer, while employing the patterned planarizing stop layer in conjunction with a chemical mechanical polish planarizing method employing a cerium oxide slurry composition, to form a patterned planarized layer within the aperture.

16. The method of claim 15 wherein the substrate is employed within a microelectronic product selected from the group consisting of semiconductor products, ceramic substrate products and optoelectronic products.

17. The method of claim 15 wherein the substrate comprises a material selected from the group consisting of conductor materials, semiconductor materials, dielectric materials and laminates thereof.

18. The method of claim 15 wherein the patterned planarizing stop layer is formed to a thickness of from about 400 to about 1600 angstroms.

19. The method of claim 15 wherein the hydrogenated silicon nitride material is formed employing a plasma enhanced chemical vapor deposition method.

20. The method of claim 15 wherein the cerium oxide slurry composition does not employ a surfactant.

* * * * *